US009185314B2

United States Patent
Mantri et al.

(10) Patent No.: US 9,185,314 B2
(45) Date of Patent: Nov. 10, 2015

(54) MITIGATING THE EFFECTS OF SIGNAL OVERLOAD IN ANALOG FRONT-END CIRCUITS USED IN IMAGE SENSING SYSTEMS

(75) Inventors: Rajiv Shrikant Mantri, Bangalore (IN); Nagesh Surendranath, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 695 days.

(21) Appl. No.: 13/291,100

(22) Filed: Nov. 8, 2011

(65) Prior Publication Data

US 2013/0113461 A1    May 9, 2013

(51) Int. Cl.
| | |
|---|---|
| *H04N 5/359* | (2011.01) |
| *H04N 5/374* | (2011.01) |
| *H04N 5/378* | (2011.01) |
| *H01L 27/146* | (2006.01) |
| *H04N 5/32* | (2006.01) |
| *H04N 5/33* | (2006.01) |
| *H04N 5/367* | (2011.01) |

(52) U.S. Cl.
CPC .......... *H04N 5/359* (2013.01); *H01L 27/14609* (2013.01); *H04N 5/374* (2013.01); *H04N 5/378* (2013.01); *H04N 5/32* (2013.01); *H04N 5/33* (2013.01); *H04N 5/367* (2013.01)

(58) Field of Classification Search
CPC .......................... H04N 5/378; H01L 27/14609
USPC ................. 250/370.08, 370.09, 208.1, 214 R
See application file for complete search history.

(56) References Cited

U.S. PATENT DOCUMENTS

| | | | | |
|---|---|---|---|---|
| 5,677,940 | A | * | 10/1997 | Suzuki et al. .................... 378/38 |
| 6,720,594 | B2 | | 4/2004 | Rahn et al. |
| 7,566,878 | B2 | * | 7/2009 | Iwakiri ..................... 250/370.09 |
| 8,334,496 | B2 | * | 12/2012 | Guellec et al. ............ 250/214 R |
| 2011/0127441 | A1 | * | 6/2011 | Tanabe ..................... 250/370.08 |

* cited by examiner

*Primary Examiner* — David Porta
*Assistant Examiner* — Mindy Vu
(74) *Attorney, Agent, or Firm* — Alan A. R. Cooper; Frank D. Cimino (57) ABSTRACT

Output voltage of a charge-to-voltage converter used in an image sensing system is compared with one or more thresholds to determine if the output voltage exceeds predetermined threshold levels. If the output voltage exceeds one or more of the threshold levels, the input terminal of the charge-to-voltage converter is connected to a reference voltage to prevent the charge-to-voltage converter from saturating. Problems that could be caused due to overload of the voltage-to-charge converter are obviated. In an embodiment, the charge-to-voltage converter is implemented by an operational amplifier (OPAMP). A pair of comparators compares the output of the OPAMP with corresponding threshold voltages. The result of the comparison is used to generate a signal for connecting the input of the OPAMP to the reference voltage, thereby preventing saturation of the OPAMP.

12 Claims, 6 Drawing Sheets

MITIGATING THE EFFECTS OF SIGNAL OVERLOAD IN ANALOG FRONT-END CIRCUITS USED IN IMAGE SENSING SYSTEMS

BACKGROUND

1. Technical Field

Embodiments of the present disclosure relate generally to image sensing systems, and more specifically to techniques for mitigating the effects of signal overload in analog front-end circuits used in image sensing systems.

2. Related Art

Image sensing systems generally refer to systems used for capturing images of objects. The captured images may be suitably processed for desired applications and/or displayed. An example of an image sensing system is a digital X-ray machine. Image sensing systems typically use image sensor arrays. Sensors in the image sensor arrays generate a charge proportional to the intensity of energy or rays (such as visible light, X-rays, infra red light, etc.) incident on the sensors (and thus representative of the image to be captured). The term 'energy' is used generically herein to include rays such as those noted above. Each sensor typically corresponds to one "pixel" of the image to be captured.

Sensor arrays of an image sensing system may be connected to analog front-end (AFE) circuits. AFE circuits are typically used for amplification of the signals generated by the sensors, conversion of the signals from charge to voltage and digital representation of the voltage, etc. For example, in a digital X-ray machine, the AFE may include charge-to-voltage converters, a multiplexer and one or more analog to digital converters (ADC). The charge-to-voltage converter is typically implemented by an amplifier configured as a signal integrator. One problem that may occur in an AFE (and more specifically in the charge-to-voltage converter in the AFE) of an image sensing system is signal overload. Signal overload of a charge-to-voltage amplifier occurs when the magnitude of charge received as input is such as to cause the output voltage of the charge-to-voltage amplifier to exceed desired operating thresholds. Such signal overload may be caused by a large amount of energy being incident on a pixel, resulting in an excessively 'bright' pixel. Other causes of signal overload may include readout of a defective pixel/sensor in the image sensor array. Signal overload may result in images generated by the image sensing system to be blurred or otherwise not faithfully representative of the imaged object.

One prior technique to address the problem noted above employs an additional transistor in each pixel (sensor) in the image sensor array, the transistor operating as a clamp to prevent signal overload of the charge-to-voltage amplifier. Another prior technique reduces the possibility of such signal overload by laser-cutting defective sensors in the sensor array. A yet another prior technique employs special materials with smaller dielectric constant and adsorption for implementing the signal lines (interconnect) from each sensor.

The prior techniques noted above are implemented in the image sensor arrays (and not in the AFE), and may be associated with increased cost. Further, having to rely on such implementation in the image sensor array provides lesser flexibility for a system integrator in integrating sub-systems, components and modules that make up an image sensing system.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

A circuit in an image sensing system includes a charge-to-voltage converter and a switch. The charge-to-voltage converter is connected to receive an amount of electrical charge on an input terminal. The charge represents an intensity of incident energy on a pixel in an image sensor in the image sensing system. The charge-to-voltage converter is designed to generate a corresponding voltage on an output terminal. The switch is connected between the input terminal of the charge-to-voltage converter and a reference voltage. The switch is operable to be closed if the voltage generated by the charge-to-voltage converter exceeds the magnitude of the reference voltage.

Several embodiments of the present disclosure are described below with reference to examples for illustration. It should be understood that numerous specific details, relationships, and methods are set forth to provide a full understanding of the embodiments. One skilled in the relevant art, however, will readily recognize that the techniques can be practiced without one or more of the specific details, or with other methods, etc.

BRIEF DESCRIPTION OF THE VIEWS OF DRAWINGS

Example embodiments will be described with reference to the accompanying drawings briefly described below.

The drawing in which an element first appears is indicated by the leftmost digit(s) in the corresponding reference number.

DETAILED DESCRIPTION

Various embodiments are described below with several examples for illustration.

1. Example Environment

Figure 1:
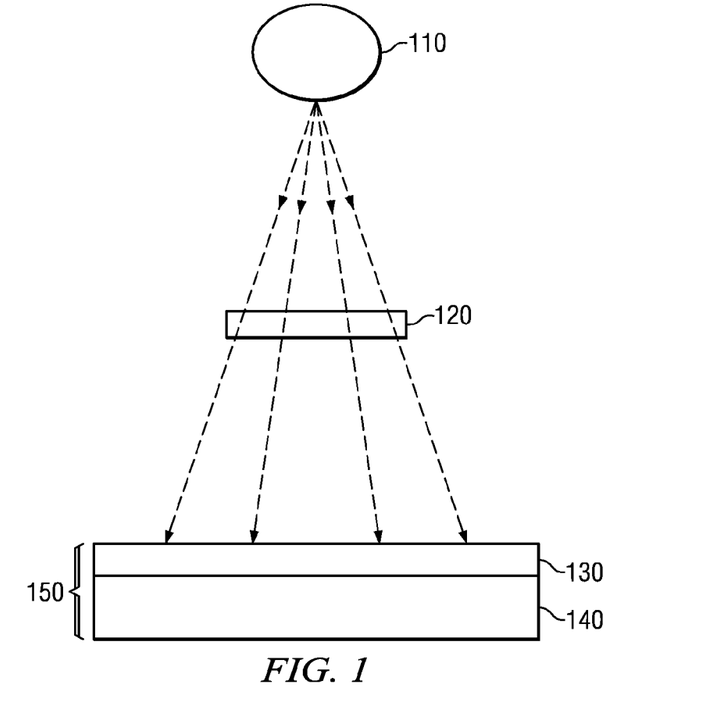
FIG. 1 is a block diagram illustrating the details of an example system in which several embodiments can be implemented.

FIG. 1 is a block diagram of an example environment in which several embodiments can be implemented. Shown in FIG. 1 are X-ray source 110, an object 120 whose X-rayed image is to be taken, and a digital X-ray machine 150. Digital X-ray machine 150 is shown containing scintillator 130 and image sensing unit 140. Prior to impinging on scintillator 130, X-rays from source 110 pass through object 120 with varying degrees of absorption depending on the internal details (such as structural density) of object 120. Scintillator 130 converts the X-rays incident on it to visible light, which is then incident on image sensor arrays contained in image sensing unit 140. Device 150 is assumed to be a digital X-ray machine merely by way of illustration. Embodiments of the present disclosure can be implemented in other types of machines as well, such as those that are designed to operate with visible light and infra red rays as source 110.

Figure 2:
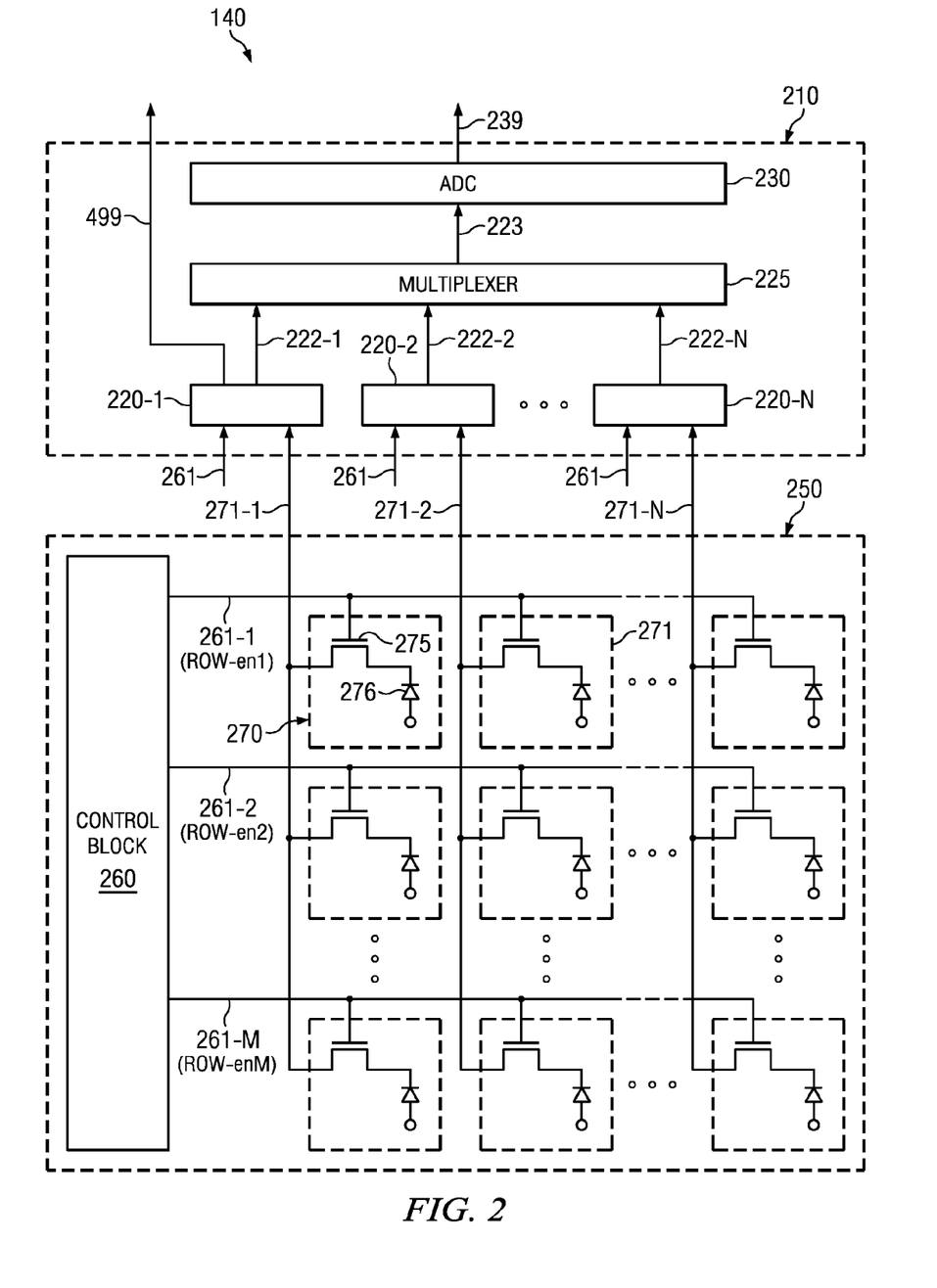
FIG. 2 is a diagram illustrating the internal details of a portion of an image sensing unit in an embodiment.

Each sensor in image sensing unit 140 converts incident light to a corresponding electrical charge (or current). FIG. 2 is a diagram illustrating the internal details of a portion of image sensing unit 140 in an embodiment. Shown in FIG. 2 are an image sensor array (array) 250 and an analog front-end circuit (AFE) 210. Image sensing unit 140 typically contains several sensor arrays similar to array 250, and correspondingly several AFE circuits similar to AFE 210. Only one of each is shown in FIG. 2 for simplicity.

Array 250 is shown containing control block 260, and an array of sensor blocks. The sensor blocks (or simply sensors, each of which correspond to a pixel of a corresponding image) are shown organized as M rows and N columns Each sensor (e.g., 270) includes a photodiode (e.g., 276) and a readout transistor (e.g., 275). Control block 260 sequentially generates "row enable" signals 261-1 through 261-M to enable readout of charge generated by corresponding sensors in each of rows 261-1 through 261-M, typically one row at a time and in a sequential manner.

AFE 210 is shown containing amplifiers 220-1 through 220-N, multiplexer (MUX) 225 and ADC 230. Each of amplifiers 220-1 through 220-N receives outputs of the respective sensors via column-paths 271-1 through 271-N at corresponding time intervals, and converts the respective charge values to corresponding voltages, provided on corresponding paths 222-1 through 222-N. in addition, each of amplifiers 220-1 through 220-N also receives row enable signals 261-1 through 261-M. Path 261 is deemed to contain all row enable signals 261-1 through 261-M. MUX 225 forwards, on path 223, one of the voltages generated on paths 222-1 through 222-N, and may be controlled by a select signal (not shown). ADC 230 generates digital codes representing the voltages received on path 223, and provides the digital codes on path 239. In an embodiment, AFE 210 is implemented as an integrated circuit (IC).

Figure 3:
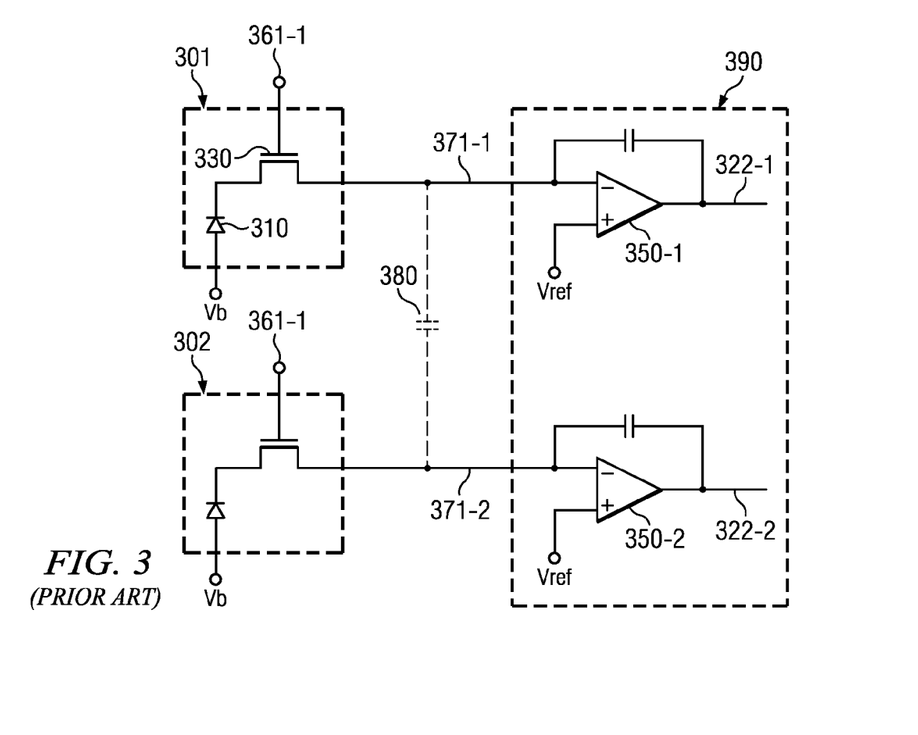
FIG. 3 is a diagram of a portion of a prior image sensing unit.

FIG. 3 shows a portion of a prior image sensing unit. Sensors 301 and 302 are provided in an image sensing array. Component 390 represents a portion of a prior AFE. Sensor 301 is shown containing photodiode 310 and readout transistor 330. Sensor 302 is shown similarly containing a photodiode and a readout transistor. Sensors 301 and 302 are neighboring sensors, similar to sensors 270 and 271 of FIG. 2. Vb represents a reference voltage whose value is set so that the photodiodes of sensors 301 and 302 are reverse-biased. Node 361-1 receives a control signal to simultaneously switch-ON both of the readout transistors of sensors 301 and 302. Prior amplifiers 350-1 and 350-2 of AFE 390 correspond to amplifiers 220-1 and 220-2 of FIG. 2. Paths 371-1 and 371-2 of FIG. 3 correspond respectively to paths 271-1 and 271-2 of FIG. 2.

In readout cycles, in which signal 361-1 is asserted, both the readout transistors of sensors 301 and 302 are ON, and the charge generated (due to incident light, and stored in the internal capacitances of photodiodes of sensors 301 and 302) are provided respectively on paths 371-1 and 371-2. Amplifiers 350-1 and 350-2 are each configured as integrators, and convert the charges on paths 371-1 and 371-2 to respective voltages 322-1 and 322-2.

Either of voltages on paths 322-1 and 322-2 may exceed acceptable threshold limits. The threshold limits typically equal the saturation voltages of amplifiers 350-1 and 350-2. As noted above, several factors may cause such overload. For example, one or both of pixels 301 and 302 may be excessively bright due to a low energy absorption or attenuation in the corresponding part of object 120. Another instance is when photodiodes of either of sensors 301 and 302 are faulty. For example, when photodiode 310 is a short, the signal on path 371-1 equals voltage Vb, which may have a magnitude such that output 322-1 is driven to one of the power supply rails of amplifier 350-1. When the output of an amplifier (such as amplifiers 350-1 or 350-2) is driven beyond acceptable thresholds (typically equaling corresponding saturation voltages), the amplifier is termed to be overloaded, overdriven or saturated.

As is well known in the relevant arts, an overdriven amplifier may require a finite interval of time to recover from the saturated state before it can respond to a new value of input. Thus, assuming amplifier 220-1 is overdriven, a finite time interval may be required before amplifier 220-1 can correctly amplify a next input received on path 271-1 (FIG. 2). As a result, the voltage generated corresponding to one or more subsequent readout(s) of corresponding sensors may be in error. To illustrate with respect to FIG. 2, assuming the charge read out corresponding to sensor 270 drives amplifier 220-1 to saturation, the voltages generated by amplifier 220-1 corresponding to the charge generated by other sensors connected to column 271-1 may be in error. Such a phenomenon may also be referred to as pixel crosstalk, and results in inaccuracies in the images generated by an image sensing unit.

Specifically, due to amplifier saturation, nodes 371-1 and 371-2 may no longer be held at voltage Vref, which may result in additional crosstalk from one column to another due to coupling via parasitic capacitances such as capacitance 380. Recovery from such additional crosstalk due to the effects of such parasitic capacitances may also be very slow, giving rise to additional crosstalk.

2. Mitigating the Effects of Overload

Figures 4, 5:
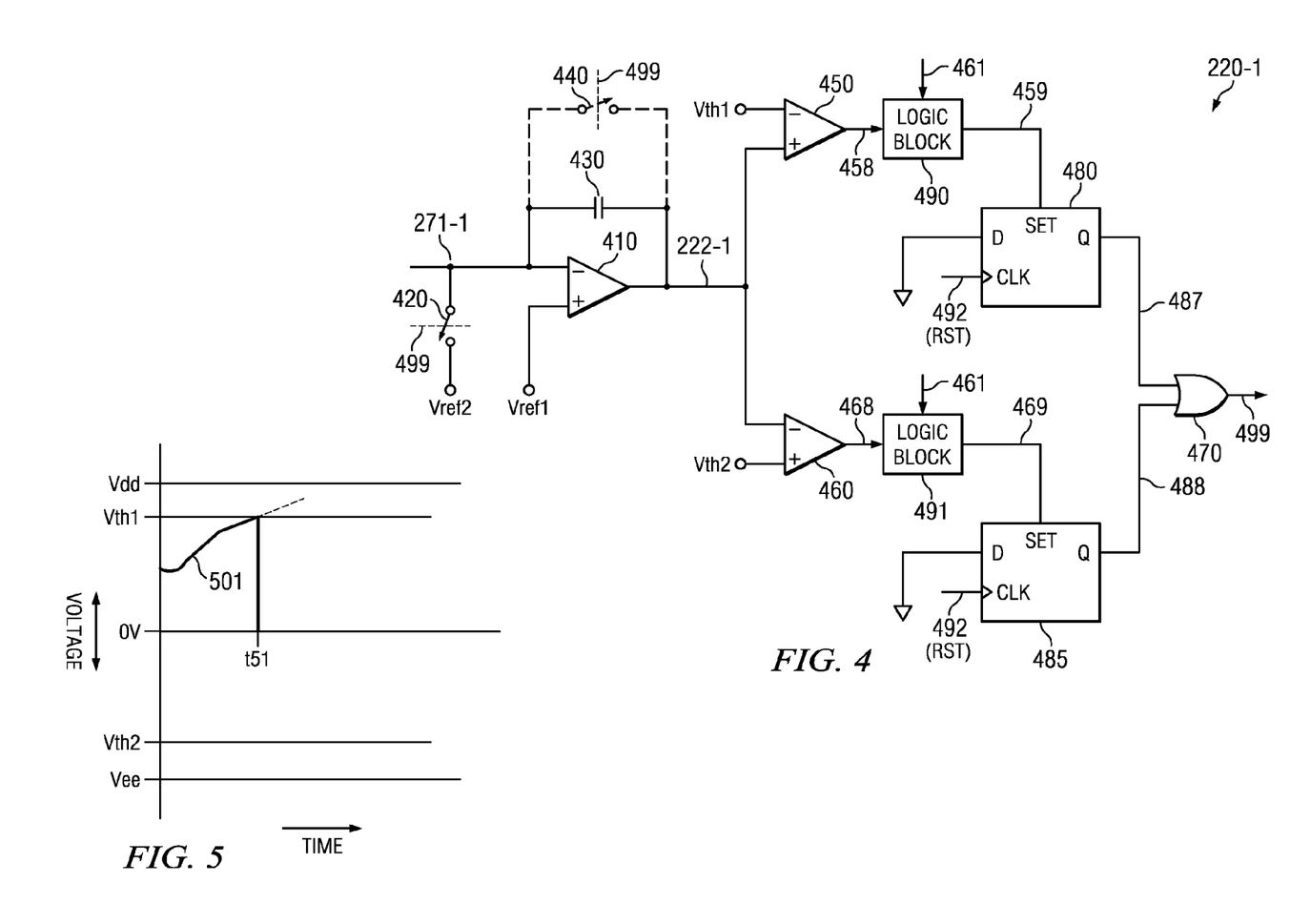
FIG. 4 is a diagram illustrating the manner in which overload of an analog front end (AFE) used in an image sensing unit is mitigated in an embodiment.
FIG. 5 is a diagram showing example variations with respect to time of a voltage signal representing a pixel.

FIG. 4 is a diagram illustrating the manner in which overload of an AFE used in an image sensing unit is mitigated in an embodiment. Amplifier 220-1 is shown containing operational amplifier (OPAMP) 410, switch 420, capacitor 430, comparators 450 and 460, flip-flops (memory elements) 480 and 485, OR gate 470, and logic blocks 490 and 491. While the description below is provided with respect to the implementation details of amplifier 220-1 of FIG. 4, each of the other amplifiers 220-2 through 220-N of AFE 210 of FIG. 2 can also be implemented in a similar manner. Vref1 and Vref2 represent reference voltages and may be the same node (i.e., the same voltage value) in some embodiments.

OPAMP 410 and capacitor 430 together form a charge-to-voltage converter, and convert the charge received on path 271-1(input terminal) to a corresponding voltage on path 222-1 (output terminal). Comparator 450 (first comparator) compares voltage 222-1 with a threshold voltage Vth1 (first threshold voltage), and generates output 458 as a logic one (or logic high) if voltage 222-1 exceeds Vth1, and as a logic zero (logic low) otherwise. Comparator 460 compares voltage 222-1 with another threshold voltage Vth2, and generates output 468 as a logic one if voltage 222-1 is less than Vth2, and as logic zero otherwise. In an embodiment, thresholds Vth1 and Vth2 are as shown in FIG. 5. The details of FIG. 5 assume that OPAMP 410 is a dual-supply OPAMP with Vdd and Vee as the positive and negative supplies respectively, and thresholds Vth1 and Vth2 are respectively slightly less than the positive and negative saturation voltages of OPAMP 410.

Logic block 490 (first logic block) and logic block 491 (second logic block) are identical and are each shown receiving enable signal 461. Enable signal 461 may be generated within AFE 210, or be received from a circuit external to AFE 210. Enable signal 461 may be designed to be asserted in every read cycle, and after allowing for potential transients in signal 222-1 to settle. Example waveforms for signal 461 are shown in the timing diagrams of FIGS. 6, 7 and 8. Logic blocks 490 and 491 assert signal their respective outputs 459 and 469 only when signal 461 is also asserted and when signal 222-1 crosses thresholds Vth1 or Vth2. In other embodiments, logic blocks 490 and 491 may not be implemented, and signals 458 and 468 are instead directly provided to the asynchronous SET terminals of respective flip-flops 480 and 485.

The asynchronous SET input of flip-flop (FF) 480 (first memory element) is connected to signal 459. The data (D) input of FF 480 is grounded, and the clock (CLK) input of FF 480 is connected to a reset signal 492 (RST). The asynchronous SET input of FF 485 is connected to signal 469. The data (D) input of FF 485 is grounded, and the clock (CLK) input of FF 485 is connected to RST. The Q outputs 487 and 488 of respective FFs 480 and 485 are logically ORed by OR gate 470, and the result is generated on path 499. RST represents a reset signal, and may be provided to AFE 210 from array 250 (of FIG. 2), or from an external control circuit, or be generated internally within AFE 210 based on other input controls.

The specific circuit components and connections for generating signal 499 are shown merely by way of illustration. Signal 499 can be generated using other circuits as well, as would be apparent to one skilled in the relevant arts. For example, the D inputs of FF 480 and FF 485 can instead be permanently set to logic high, with the CLK inputs of FF 480 and FF 485 being instead connected respectively to signals 459 and 469, with the asynchronous clear inputs (not shown) of each of FF 480 and FF485 connected to RST (492). Such alternative circuit connections would generate signal 499 with the same characteristics and functionality as in FIG. 4.

Thresholds Vth1 and Vth2 respectively equal voltages at which OPAMP 410 enters into positive or negative saturation. Alternatively, threshold Vth1 may be set to be slightly less than the positive saturation voltage of OPAMP 410, and Vth2 may be set to be slightly greater than (more positive than) the negative saturation voltage of OPAMP 410.

Waveform 501 shown in FIG. 5 represents an example variation of output voltage 222-1 with respect to time. Thus, as shown in FIG. 5, when waveform 501 exceeds Vth1, the input to OPAMP 410 is connected to Vref2 (first reference voltage) by closing switch 420 (first switch), thereby preventing OPAMP 410 from saturating. With switch 420 closed, output 222-1 may have a value dependent on the offset voltage of OPAMP 410, but such that OPAMP 410 does not saturate. In FIG. 5, the signal 222-1 is shown as being forced to 0V at t51.

In other embodiments, output 222-1 may be forced to a desired 'safe' voltage using a switch at the output of OPMAP 410, such a switch being operated to force output 222-1 to the desired safe voltage, and thus preventing OPAMP 410 from saturating.

Waveform 501 of FIG. 5 assumes that both Vref1 and Vref2 equal 0V. However, in other embodiments, Vref1 may differ from Vref2, and each may have values other than 0V (e.g., 1.6V in one embodiment), but which are selected to ensure that OPAMP 410 does not saturate. It may be desirable to have separate voltage sources or voltage references for supplying Vref1 and Vref2 even if the voltages of Vref1 and Vref2 are designed to be equal. While amplifier 220-1 is shown and described as containing a pair of comparators for comparison of signal 222-1 with a corresponding pair of threshold voltages, in other embodiments the generation of signal 499 may be performed based on comparison of signal 222-1 with only one threshold voltage (Vth1 or Vth2). In such other embodiments, only one pair of comparator and flip-flop (e.g., only comparator 450 and FF 480 and the corresponding interconnections) may be implemented.

Further, although noted above with respect to FIG. 5 as being a dual-supply OPAMP, in other embodiments OPAMP 410 may instead be designed to be a single-supply OPAMP. In such embodiments, thresholds Vth1 and Vth2 may be correspondingly different, or only one threshold may be used. Further, the combination of OPAMP 410 and capacitor 430 are noted herein as performing the charge-to-voltage conversion, other circuits (non-OPAMP based circuits) may also be used instead to perform such conversion, as will be apparent to one skilled in the relevant arts.

Figure 6:
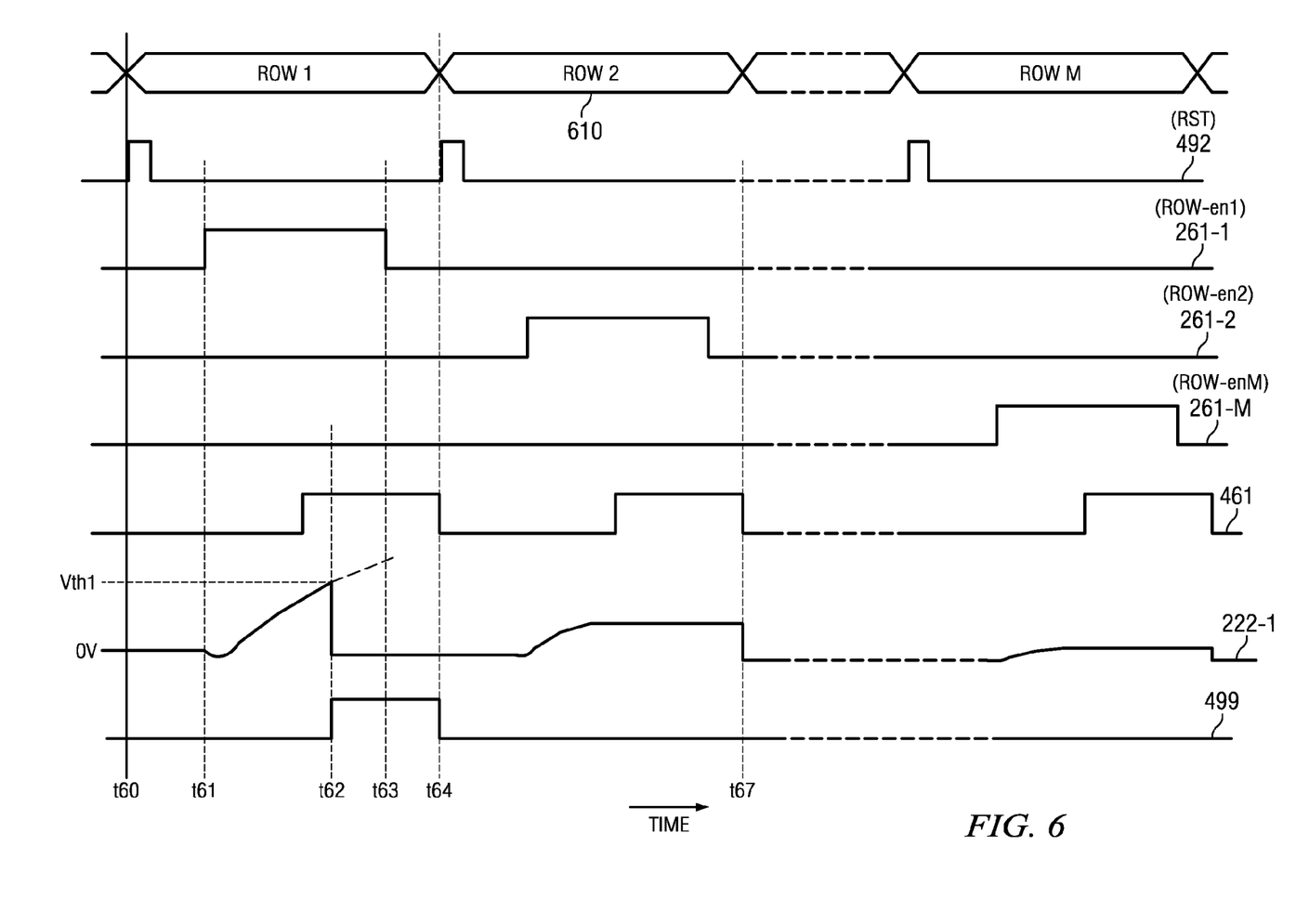
FIG. 6 is an example timing diagram illustrating the operating of an amplifier used in an image sensing unit in an embodiment.

The operation of amplifier 220-1 is now described with reference to the example timing diagram of FIG. 6. In FIG. 6, waveform 610 illustrates the operation of reading sensor outputs of the rows of sensor array 250. Outputs of sensors of Row 1 (261-1 in FIG. 2) are indicated as being read in interval t60-t64. Outputs of sensors of Row 2 (261-2 in FIG. 2) are indicated as being read in interval t64-t67, and so on. The read operation in each of intervals such as t60-t64 is referred to herein as a read cycle. The corresponding row enable signals are shown as being asserted (to logic high) in the corresponding read cycles. Signal 461 is shown being asserted (to logic high) in each read cycle after some delay (to allow transients in signal 222-1 to settle or die out) from the start of assertion of the corresponding row enable signal. De-assertion of signal 461 is shown as coinciding with the end of the corresponding read cycle, and the assertion of RST.

RST is asserted (logic high) at the start of each read cycle. The D inputs of FFs 480 and 485 being tied to logic zero (ground), Q outputs 487 and 488 are reset to logic zero at the start of each read cycle (signals 459 and 469 are assumed to be inactive). Thus, outputs 487 and 488 are at logic zero at (or slightly later than) t60. Consequently, output 499 of OR gate 470 is at logic zero.

In an embodiment, logic blocks 490 and 491 are designed such that output 499 is set to logic one only if enable signal 461 is asserted and signal 222-1 has crossed either of thresholds Vth1 or Vth2. In other embodiments, however, logic blocks 490 and 491 may be designed such that output 499 is generated without regard to enable signal 461. In such other embodiments, logic blocks 490 and 491 are not implemented, and signals 458 and 468 are provided directly to the asynchronous SET inputs of FF480 and FF485 respectively. In such embodiments, at t61, row-en1 (261-1) switches to logic high, and readout transistors in row 261-1 (FIG. 2) are enabled. At t61, OPAMP 410 starts integrating the charge received on path 271-1. At t62, output 222-1 crosses (is slightly higher than) threshold Vth1. As a result, output 458 of comparator is activated (assumed to be to logic high), and asynchronously sets output 487 to logic high. As a result, signal 499 is also at logic high. A logic high value of signal 499 closes switch 420, and signal 271-1 changes to Vref2.

Signal 499 is at logic one in the interval t62-t64. At t64, a next read cycle starts and RST is asserted. Due to the assertion of RST, signal 499 transitions to logic zero. In the next read cycle, signal 222-1 remains within thresholds Vth1 and Vth2 and signal 499 is not asserted.

Figure 7:
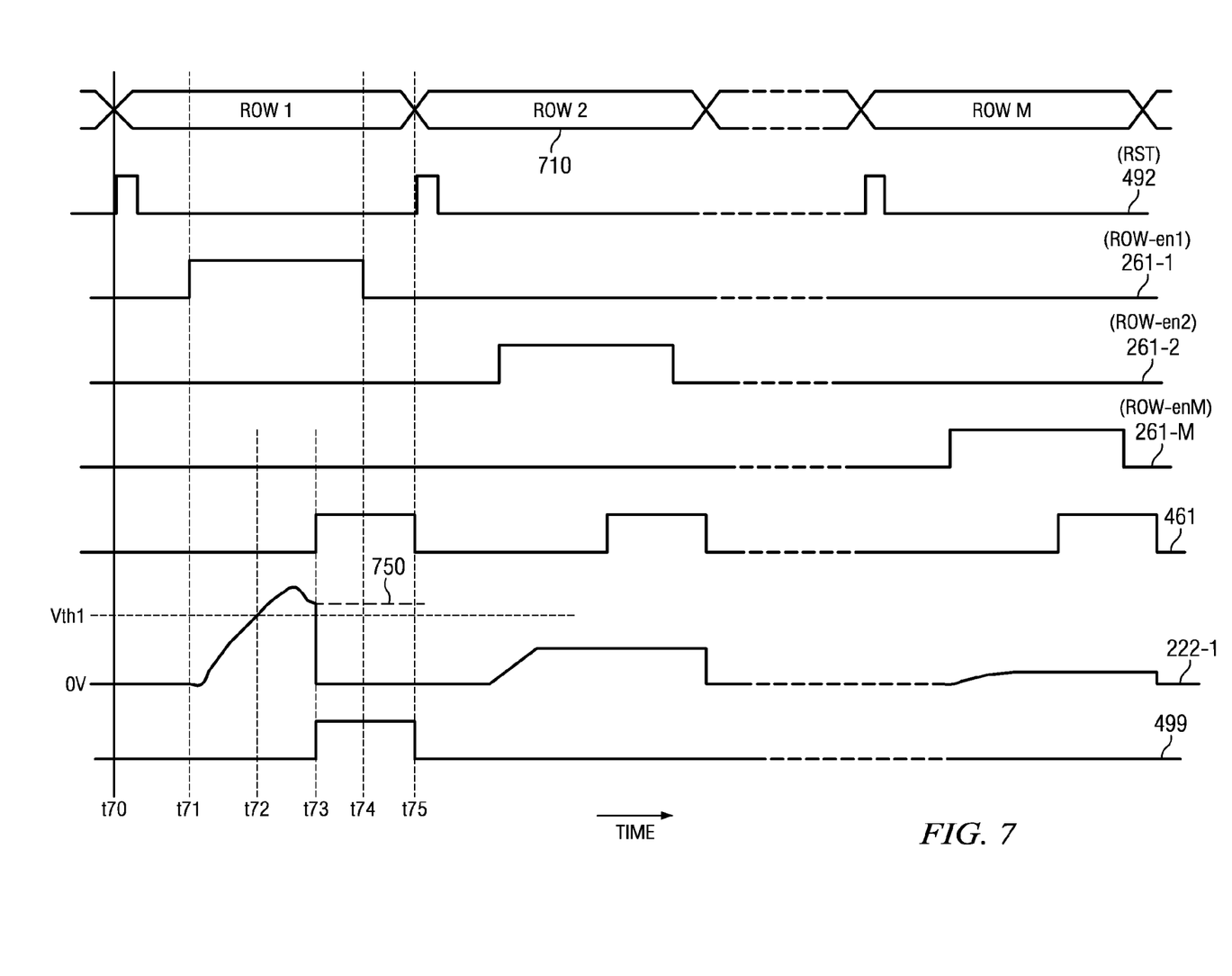
FIG. 7 is another example timing diagram illustrating the operating of an amplifier used in an image sensing unit in an embodiment.

In another embodiment, and as illustrated with respect to FIG. 7, logic blocks 490 and 491 are designed to assert signal 499 (in the event of excursions of signal 222-1 beyond the corresponding thresholds) only when signal 461 is asserted. In FIG. 7, interval t70-t75 represents a read cycle corresponding to row 1 of array 250 (FIG. 2). Row-en1 is at logic high in interval t71-t74. Output 222-1 is shown as crossing threshold Vth1 at time instance t72. However, logic block 490 sets signal 499 to logic high only at t73 when signal 461 is asserted. Logic block resets signal 499 to logic zero at t75. Dotted line 750 indicates the steady state level of signal 222-1 in the absence of closing of switch 420.

Figure 8:
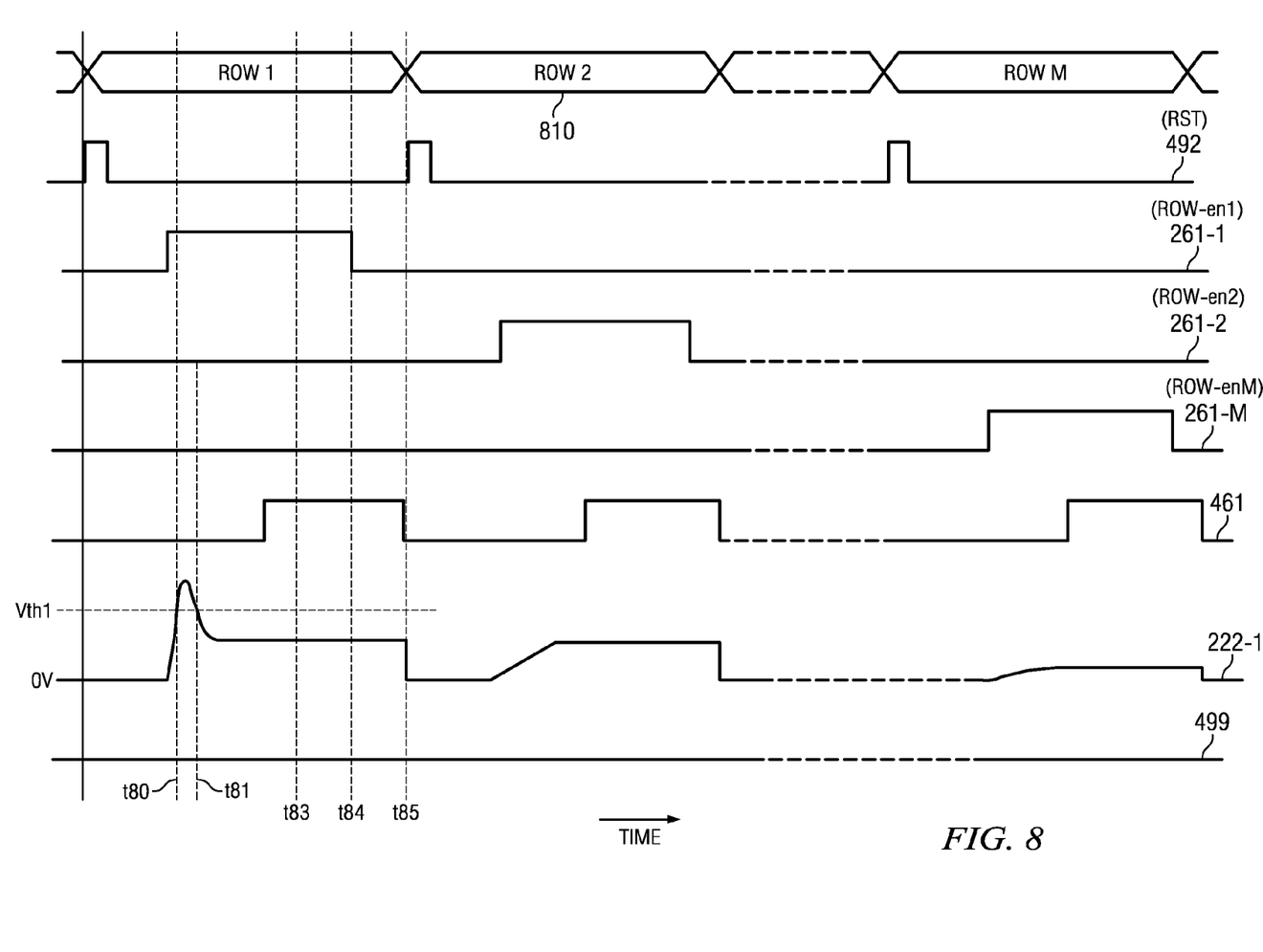
FIG. 8 is yet another example timing diagram illustrating the operating of an amplifier used in an image sensing unit in an embodiment.

Such use of enable signal 461 allows for transients in signal 222-1. Such transients may exceed the corresponding thresholds (Vth1 and Vth2) for a short duration of time, but may be acceptable since they may not drive OPAMP 410 to saturation for long duration, i.e., OPMAP 410 may be able to recovery from saturation quickly despite such transients. An example is shown in FIG. 8. Signal 222-1 exceeds threshold Vth1 in the interval t80-t81, but is within the limits specified by the thresholds following t81. The portion of signal 222-1 in the interval t80-t81 may represent a transient, and it may not be desirable to close either of switches 420 or 440 in response to such transients. Signal 499 is not set to logic high in response to such transients. The duration of such transients may be determined a priori based on knowledge of system performance of array 250, and the value of the programmable delay may be set accordingly.

In an embodiment, in addition to closing switch 420 in response to excursions of signal 222-1 beyond the thresholds Vth1 and Vth2, IC 210 also forwards the logic one state of signal 499 as an output of IC 210, as shown in FIG. 2. A processor or display controller receiving the logic one state of signal 499 is designed to provide the highest value possible for the pixel to a display device on which images generated by array 250 are to be displayed. In another embodiment, signal 499 is forwarded to ADC 230 (FIG. 2), wherein signal 499 saturates the digital output of ADC 230 corresponding to the overloaded channel to an appropriate value.

In yet another embodiment, amplifier 220-1 is implemented with switch 440 (shown in dotted lines in FIG. 4) instead of with (or in addition to) switch 420. A logic high level of signal 499 closes switch 440, thereby preventing signal 222-1 from exceeding the corresponding thresholds.

Although overload of OPAMP 410 is described above as being detected at the output (222-1) of amplifier 220-1, in other embodiments, input signal 271-1 may instead be processed to detect overload. For example, comparators similar to 480 and 485 along with the similar interconnections can be implemented to compare the received charge on path 271-1 with corresponding thresholds to perform such detection. When OPAMP 410 is in saturation, input signal (271-1) also starts changing from the ideal value (Vref1), and hence saturation can be detected at the input (271-1) of amplifier 220-1 as well.

With amplifiers 220-1 through 220-N in IC 210 implemented as described above with respect to amplifier 220-1, the effects of overload may be eliminated, or at least the probability of occurrences of overload may be reduced. The problems noted above with respect to overload may thereby be obviated.

While in the illustrations of FIGS. 2 and 4, though terminals/nodes are shown with direct connections to various other terminals, it should be appreciated that additional components (as suited for the specific environment) may also be present in the path, and accordingly the connections may be viewed as being electrically coupled to the same connected terminals. In the instant application, power supply and ground terminals are referred to as constant reference potentials.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A circuit in an image sensing system, the circuit comprising:
   a charge-to-voltage converter to convert a charge to a voltage, wherein the charge represents an intensity of energy incident on a pixel in an image sensor in the image sensing system, the charge-to-voltage converter being coupled to receive the charge on an input terminal of the charge-to-voltage converter, the charge-to-voltage converter designed to amplify the charge to generate the voltage on an output terminal;
   a first switch coupled between the input terminal and a first reference voltage, wherein the first switch is configured to be closed and the input terminal reset if a magnitude of the voltage of the output terminal exceeds a first threshold voltage, the first switch being open and the input terminal not being reset otherwise,
   a first comparator coupled to receive the voltage and the first threshold voltage, the first comparator to generate a first result representing a comparison of the voltage with the first threshold voltage;
   a first memory element to store the first result,
   wherein the first result indicates whether the magnitude of the voltage exceeds the magnitude of the first threshold voltage,
   wherein the charge-to-voltage converter is an operational amplifier (OPAMP) comprising an output terminal and a pair of input terminals, wherein a capacitor is coupled between the output terminal and a first one of the pair of input terminals, wherein the second one of the pair of input terminals is coupled to a second reference voltage;
   a second comparator coupled to receive the voltage and a second threshold voltage, the second comparator to generate a second result representing a comparison of the voltage with the second threshold voltage;
   a second memory element to store the second result; and
   an OR gate to generate a logical-OR result of the first result and the second result,
   wherein a first logic value of the logical-OR result causes the first switch to be closed.

2. The circuit of claim 1, further comprising:
   a first logic block coupled to receive the first result and an enable signal as inputs, the first logic block designed to forward the first result to the first memory element for storage only if the enable signal is asserted; and
   a second logic block coupled to receive the second result and the enable signal as inputs, the second logic block designed to forward the second result to the second memory element for storage only if the enable signal is asserted.

3. The circuit of claim 2, further comprising:
   a second switch coupled in parallel with the capacitor, wherein the logical-OR result is designed to close the second switch instead of the first switch.

4. The circuit of claim 1, wherein the energy is in the form of one of visible light rays, infra red rays and X rays.

5. A circuit, comprising:
a plurality of amplifiers including a first amplifier, wherein each of the plurality of amplifiers is coupled to receive a corresponding charge representing an intensity of energy incident on a corresponding pixel in an image sensor comprised in the image sensing system, each of the plurality of amplifiers designed to integrate the corresponding charge to generate a corresponding voltage as an output;
a multiplexer (MUX) coupled to receive outputs of each of the plurality of amplifiers and to forward a selected one of the outputs; and
an analog to digital converter (ADC) coupled to receive the selected one of the outputs, the ADC to generate a digital value representing a magnitude of the selected one of the outputs,
wherein the first amplifier comprises:
a charge-to-voltage converter to convert a charge to a voltage, the charge-to-voltage converter being coupled to receive the charge on an input terminal, the charge-to-voltage converter designed to integrate the charge to generate the voltage on an output terminal; and
a first switch coupled between the input terminal and a first reference voltage,
wherein the first switch is configured to be closed and the input terminal reset if a magnitude of the voltage of the output terminal exceeds a first threshold voltage, the first switch being open and the input terminal not being reset otherwise;
wherein the first amplifier further comprises:
a first comparator coupled to receive the voltage and the first threshold voltage, the first comparator to generate a first result representing a comparison of the voltage with the first threshold voltage; and
a first memory element to store the first result;
wherein the charge-to-voltage converter is an operational amplifier (OPAMP) comprising an output terminal and a pair of input terminals, wherein a capacitor is coupled between the output terminal and a first one of the pair of input terminals, wherein the second one of the pair of input terminals is coupled to a second reference voltage;
wherein the first amplifier further comprises:
a second comparator coupled to receive the voltage and a second threshold voltage, the second comparator to generate a second result representing a comparison of the voltage with the second threshold voltage;
a second memory element to store the second result; and
an OR gate to generate a logical-OR result of the first result and the second result,
wherein a first logic value of the logical-OR result causes the first switch to be closed.

6. The circuit of claim 5, wherein the first amplifier further comprises:
a first logic block coupled to receive the first result and an enable signal as inputs, the first logic block designed to forward the first result to the first memory element for storage only if the enable signal is asserted; and
a second logic block coupled to receive the second result and the enable signal as inputs, the second logic block designed to forward the second result to the second memory element for storage only if the enable signal is asserted.

7. The circuit of claim 6, wherein the first amplifier further comprises:
a second switch coupled in parallel with the capacitor,
wherein the logical-OR result is designed to close the second switch instead of the first switch.

8. The circuit of claim 5, wherein the energy is in the form of one of visible light rays, infra red rays and X rays.

9. A system comprising:
an image sensor array to generate electrical signals representing the intensity of energy incident on corresponding pixels in the image sensor array; and
an analog front-end (AFE) integrated circuit (IC),
wherein the AFE IC comprises:
a charge-to-voltage converter to convert a charge to a voltage, wherein the charge is comprised in the electrical signals, the charge-to-voltage converter being coupled to receive the charge on an input terminal, the charge-to-voltage converter designed to integrate the charge to generate a voltage on an output terminal; and
a first switch coupled between the input terminal and a first reference voltage,
wherein the first switch is configured to be closed and the input terminal reset if a magnitude of the voltage of the output terminal exceeds a first threshold voltage, the first switch being open and the input terminal not being reset otherwise,
wherein the first amplifier further comprises:
a first comparator coupled to receive the voltage and the first threshold voltage, the first comparator to generate a first result representing a comparison of the voltage with the first threshold voltage; and
a first memory element to store the first result,
wherein the first result indicates whether the magnitude of the voltage exceeds the magnitude of the first threshold voltage,
a second comparator coupled to receive the voltage and a second threshold voltage, the second comparator to generate a second result representing a comparison of the voltage with the second threshold voltage;
a second memory element to store the second result; and
an OR gate to generate a logical-OR result of the first result and the second result,
wherein a first logic value of the logical-OR result causes the first switch to be closed.

10. The system of claim 9, further comprising a source to generate the energy, wherein the energy is in the form of one of visible light rays, infra red rays and X rays.

11. The system of claim 10, wherein charge-to voltage converter and the first switch are comprised in a first amplifier, the AFE IC further comprising:
a plurality of amplifiers including the first amplifier, wherein each of the plurality of amplifiers is coupled to receive a corresponding charge comprised in the electrical signals, each of the plurality of amplifiers designed to integrate the corresponding charge to generate a corresponding voltage as an output;
a multiplexer (MUX) coupled to receive outputs of each of the plurality of amplifiers and to forward a selected one of the outputs; and
an analog to digital converter (ADC) coupled to receive the selected one of the outputs, the ADC to generate a digital value representing a magnitude of the selected one of the outputs.

12. The system of claim 11, wherein the charge-to-voltage converter is an operational amplifier (OPAMP) comprising an output terminal and a pair of input terminals, wherein a capacitor is coupled between the output terminal and a first one of the pair of input terminals, wherein the second one of the pair of input terminals is coupled to a second reference voltage.

* * * * *